United States Patent
Wasserman et al.

(10) Patent No.: US 6,173,071 B1
(45) Date of Patent: *Jan. 9, 2001

(54) APPARATUS AND METHOD FOR PROCESSING VIDEO DATA IN AUTOMATIC OPTICAL INSPECTION

(76) Inventors: Harold Wasserman, 8 Dogwood La., Skillman, NJ (US) 08558; Gregg E. Fuhriman, 1155 Turtle Rock La., Concord, CA (US) 94521

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/991,851

(22) Filed: Dec. 16, 1997

(51) Int. Cl.$^7$ ............................................ G06K 9/00
(52) U.S. Cl. .................. 382/147; 382/145; 382/148; 348/126; 364/786.03; 364/800; 250/559.04
(58) Field of Search ........................ 382/145, 146, 382/147, 144, 148, 149, 150, 152, 274; 356/239.3, 239.7, 239.8, 237.2, 237.4, 237.5, 376; 348/126, 125; 250/559.4, 224; 364/786.03, 800

(56) References Cited

U.S. PATENT DOCUMENTS

| 4,185,298 | * | 1/1980 | Billet et al. | 348/129 |
|---|---|---|---|---|
| 4,395,697 | * | 7/1983 | Dargel et al. | 340/146.3 |
| 4,541,114 | * | 9/1985 | Rutenbar et al. | 382/49 |
| 4,710,923 | * | 12/1987 | Nagumo | 371/2 |
| 5,103,105 | * | 4/1992 | Ikegaya et al. | 250/559.23 |
| 5,153,726 | * | 10/1992 | Billing | 358/238 |
| 5,245,421 | * | 9/1993 | Robertson et al. | 358/101 |
| 5,260,779 | | 11/1993 | Wasserman | 358/93 |
| 5,282,268 | * | 1/1994 | Mieras et al. | 345/507 |
| 5,319,584 | * | 6/1994 | Ooyabu | 364/724.01 |
| 5,325,215 | * | 6/1994 | Shibata et al. | 358/426 |
| 5,495,337 | * | 2/1996 | Goshorn et al. | 356/376 |
| 5,598,345 | * | 1/1997 | Tokura | 364/489 |

* cited by examiner

Primary Examiner—Matthew C. Bella
Assistant Examiner—Sheela Chawan
(74) Attorney, Agent, or Firm—Teradyne Legal Department

(57) ABSTRACT

An apparatus and method for inspecting a printed circuit board, whereby a list of windows encompassing respective regions of the printed circuit board are generated. The windows are then scanned, and data representing the respective regions is captured and stored. The captured data includes data relating to a plurality of pixels for each window. Next, data relating to a plurality of adjacent pixels is retrieved, and values of the adjacent pixels are summed. Finally, either the data relating to the plurality of adjacent pixels or the sum of adjacent pixel values is selected for use in subsequent processing. The apparatus and method is especially useful for determining an average brightness level for each window.

20 Claims, 2 Drawing Sheets

APPARATUS AND METHOD FOR PROCESSING VIDEO DATA IN AUTOMATIC OPTICAL INSPECTION

This invention relates generally to the manufacture of printed circuit boards, and more specifically, to manufacturing defect analyzers.

Printed circuit boards (PCB's) are typically inspected during a manufacturing process for determining whether the boards contain manufacturing defects. As a result, defective PCBs can be identified before they are incorporated into electronic products, thereby minimizing the chance that the electronic products will fail prematurely in the field.

One method of inspecting PCBs is known as automatic optical inspection (AOI), which generally uses an illumination device and video cameras mounted in an inspection head. A test computer typically controls movement of the inspection head relative to a board under inspection (BUI), thereby allowing the cameras to scan a surface of the BUI and capture video data representative of the scanned surface. The captured video data is then stored for subsequent processing. This method is used in INTERSCAN™ Automated Optical Inspection Systems, sold by TERADYNE®, Inc., Walnut Creek, Calif., USA.

The test computer typically generates a list of windows where particular features of the BUI or components attached to the BUI are to be inspected. Each window generally indicates a rectangular region on the BUI.

The video cameras then typically scan each window for capturing video data representative of the region of the BUI encompassed by the window. The captured video data generally includes information relating to pixels corresponding to each encompassed region of the BUI. The captured video data is then typically stored in a frame storage unit.

Next, the test computer typically processes the captured video data by executing algorithms. One commonly executed algorithm determines an average level of brightness for each window. This algorithm, for example, can be used for detecting solder bridges, which affect the reflectivity of the BUI and therefore the brightness level of corresponding windows.

In general, each pixel is represented by a byte of captured video data, and the value of the byte of video data is proportional to the brightness level. Accordingly, the algorithm for determining the average brightness level of a window can be described by the following pseudo-code, in which "LEFT_EDGE," "RIGHT_EDGE," "TOP_EDGE," and "BOTTOM_EDGE" refer to the boundaries of a rectangular window, and "X" and "Y" define a position for each pixel within the window:

X1=LEFT_EDGE;
X2=RIGHT_EDGE;
Y1=TOP_EDGE;
Y2=BOTTOM_EDGE;
SUM=0;
FOR X=X1 TO X2 STEP_SIZE 1
  FOR Y=Y1 TO Y2 STEP_SIZE 1
    GET PIXEL(X,Y);
    SUM=SUM+PIXEL(X,Y);
  NEXT Y;
NEXT X;
AVERAGE=SUM/[(X2−X1)*(Y2−Y1)];

In particular, the line of pseudo-code, "GET PIXEL (X,Y)," is meant to describe the step of reading information relating to the pixel at position (X,Y) from the frame storage unit. Further, the line, "SUM=SUM+PIXEL(X,Y)," is meant to describe the step of summing the value of the pixel at position (X,Y) with the values of other pixels within the window. Finally, the line, "AVERAGE=SUM/(X2−X1)*(Y2−Y1)," is meant to describe the step of dividing the "SUM" by the total number of pixels within the window, for obtaining the average value of the pixels or the average brightness level of the window.

However, we have recognized that analyzing captured video data in this way has shortcomings. In particular, the steps of reading pixel information and summing pixel values generally must be repeated for every pixel within each window. This requires a significant amount of processing time.

Although manufacturing defect analyzers may have system busses that are wide enough for reading information relating to several adjacent pixels at one time, the mere act of reading information relating to more than one pixel does not always reduce the overall processing time. This is because masking and shifting of the pixel information is generally required to ensure that each bit of pixel data has the proper significance during the summing step. The required acts of masking and shifting of data also contribute significantly to processing time.

It would therefore be desirable to have a manufacturing defect analyzer that can inspect PCB's at a rate that is faster than current methods. Such a defect analyzer would still be able to inspect the PCB's using traditional inspection algorithms.

SUMMARY OF THE INVENTION

With the foregoing background in mind, it is an object of the invention to provide a manufacturing defect analyzer that reliably detects defects on printed circuit boards at a faster rate.

The following and other objects are achieved by an apparatus for inspecting a printed circuit board including a test computer, an improved bus interface, an inspection head, and at least one frame storage unit. The improved bus interface includes an input coupled to the frame storage unit, an output coupled to the test computer, circuitry for adding values of digital data coupled to the input, and circuitry for selecting between the adding circuitry output and the input. The digital data is provided by the frame storage unit. Further, the selecting circuitry is controlled by the test computer.

Still further objects and advantages will become apparent from a consideration of the ensuing description and drawings.

BRIEF DESCRIPTION OF THE DRAWINGS

The invention will be better understood by reference to the following more detailed description and accompanying drawings in which.

DESCRIPTION OF THE PREFERRED EMBODIMENT

Figure 1:
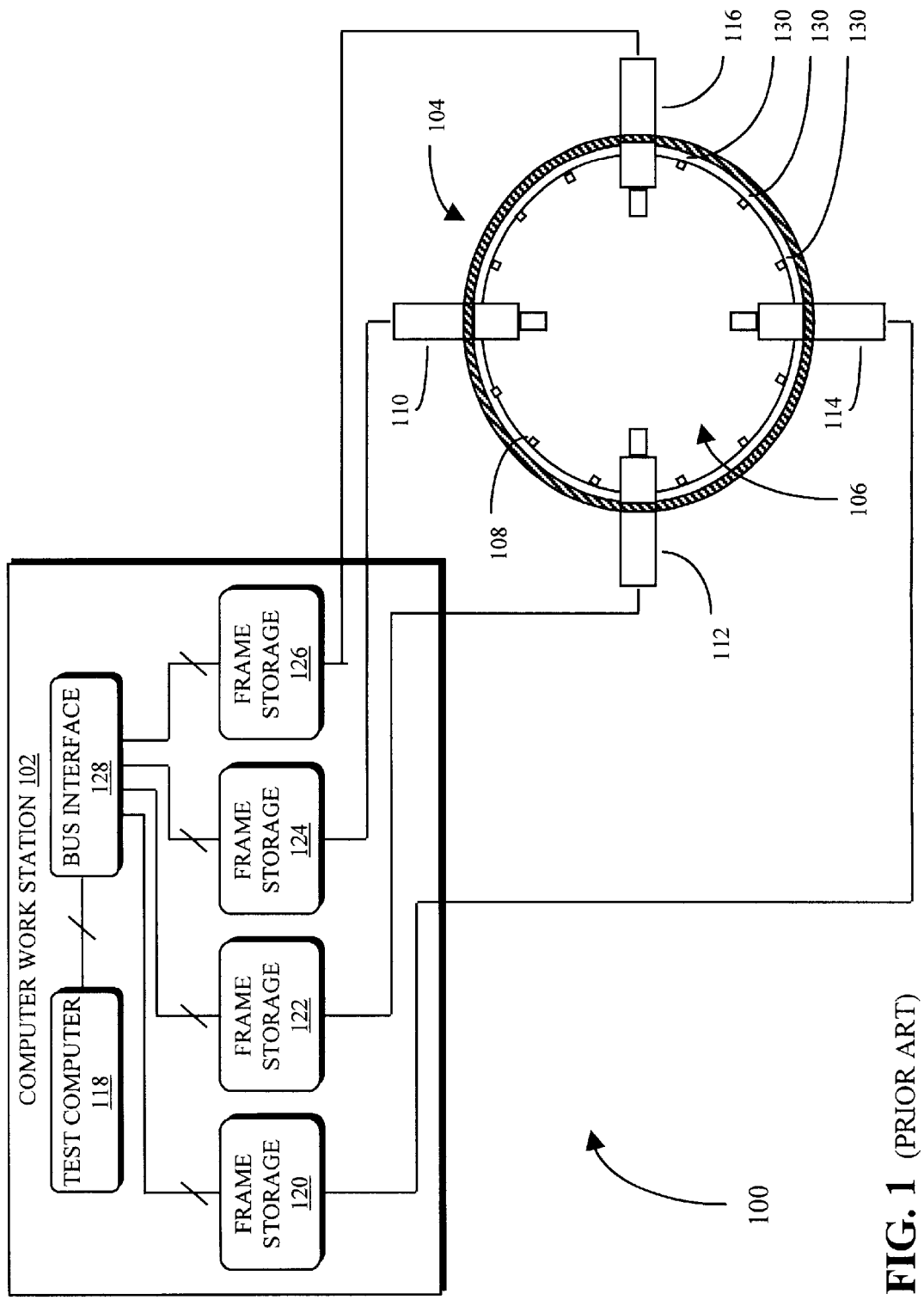
FIG. 1 is a partial block diagram of a prior art manufacturing defect analyzer for printed circuit boards.

FIG. 1 shows a partial block diagram of a prior art manufacturing defect analyzer 100 for inspecting printed circuit boards (PCB's). FIG. 1 includes a cross-sectional view of an inspection head 104, which is typically supported and moved in a defined plane by an X-Y table (not shown)

controlled by a computer work station 102. The inspection head 104 includes four video cameras 110, 112, 114, and 116, which are mounted in the inspection head 104 at 90° intervals.

Further, the cameras 110, 112, 114, and 116 are positioned so that they project downwardly toward an open bottom 106 in the inspection head 104, thereby causing their respective axes to converge on a surface of a board under inspection (BUI; not shown). This generally defines a viewing field for the cameras 110, 112, 114, and 116. The viewing field is typically rectangular with dimensions 1 inch by 1 inch.

The inspection head 104 also includes a lighting fixture 108 with numerous LED'S (e.g., the LED's 130) for selectively illuminating the surface of the BUI. The cameras 110, 112, 114, and 116 can therefore scan the illuminated surface within a plurality of viewing fields for capturing video data representative of the surface.

The computer work station 102 includes a test computer 118, a bus interface 128, and frame storage units 120, 122, 124, and 126. The cameras 110, 112, 114, and 116 provide the captured video data to the frame storage units 120, 122, 124, and 126, respectively. The frame storage units 120, 122, 124, and 126 are then selectively accessed for providing the captured video data to the bus interface 128, which includes logic for addressing the frame storage units 120, 122, 124, and 126 and for interfacing with the test computer 118. Finally, the bus interface 128 provides the captured video data to the test computer 118 for subsequent processing.

The inspection head 104; the cameras 110, 112, 114, and 116; the lighting fixture 108; the computer work station 102; the test computer 118; the bus interface 128; and, the frame storage units 120, 122, 124, and 126, generally correspond to known components. For example, additional detail about the general construction and operation of the inspection head 104 can be obtained by referring to U.S. Pat. No. 5,245,421 assigned to Control Automation Inc., Princeton, N.J., which is incorporated herein by reference.

Further, additional detail about the lighting fixture 108 can be obtained by referring to U.S. Pat. No. 5,060,065 assigned to Cimflex Teknowledge Corp., Princeton, N.J., which is incorporated herein by reference. Also, additional detail about the frame storage units 120, 122, 124, and 126 can be obtained by referring to U.S. Pat. No. 5,260,779 assigned to Control Automation Inc., which is incorporated herein by reference.

Accordingly, this discussion of the present invention will proceed with a description of an improved way of interfacing with the test computer 118 for providing the captured video data to the test computer 118 for the subsequent processing. The improved interface significantly increases the rate at which printed circuit boards can be inspected while being easily incorporated into the manufacturing defect analyzer 100.

In a typical inspection configuration, the manufacturing defect analyzer 100 scans the surface of a BUI for capturing video data representing the surface, stores the captured video data, and then processes the captured data. In particular, a test engineer loads a description of the BUI into a memory (not shown) in the test computer 118. The description typically includes a list of the components attached to the BUI, which has information relating to each component's type, location, and orientation on the BUI.

The test computer 118 then accesses a database (not shown) that stores a library of component models. The library typically includes a list of windows for each component type. Each window indicates a region of the BUI where a particular feature of a component or the surface is to be inspected. Further, the list of windows typically includes a size, a location, and a lighting selection for each window. The size of each window is typically 0.050 inch by 0.050 inch. This means that a plurality of windows may be located within one viewing field. The test computer 118 then uses this stored list of windows for generating a new list of all of the windows on the BUI that are to be inspected.

Next, the cameras 110, 112, 114, and 116 scan the windows for capturing video data representing a feature or the surface of the BUI within each window. In particular, the X-Y table (not shown) positions the inspection head 104 above the BUI, the lighting fixture 108 activates selected LED's 130, and selected video cameras 110, 112, 114, and 116 scan the windows and capture video data in accordance with the details disclosed in U.S. Pat. No. 5,060,065. The cameras 110, 112, 114, and 116 then provide the captured video data to the frame storage units 124, 122, 120, and 126, respectively.

In particular, the captured video data includes information relating to a plurality of picture elements, commonly known as pixels, corresponding to the region of the BUI encompassed by each window. Further, the number of pixels corresponding to a typical rectangular window may be calculated as M×N, wherein M and N represent the numbers of pixels along respective dimensions of the rectangular window. The total number of pixels is generally dependent upon the resolution of the cameras 110, 112, 114, and 116.

The test computer 118 then typically processes the captured video data by executing algorithms. Because the cameras 110, 112, 114, and 116 scan a region of the BUI that is illuminated by the lighting fixture 108, the algorithms typically include steps for measuring the reflectivity of the illuminated region. This is generally done by calculating an average brightness level for each window.

For example, one window may indicate a region on the BUI where a solder bridge between an adjacent pair of component leads might form. Because solder bridges generally enhance the reflectivity of the BUI, the test computer 118 typically executes an algorithm that calculates the average brightness level of the window. Accordingly, if the calculated brightness level were too high, then the test computer 118 would detect, and subsequently report, a defect relating to a solder bridge at that window location.

In the preferred embodiment, each pixel is represented by a byte (i.e., 8 bits) of captured video data. Further, the brightness level of the region of the BUI corresponding to each pixel is proportional to the value of a respective byte of data. This means that the average brightness level for a window can be calculated by first summing the values of the pixels corresponding to the region of the BUI encompassed by the window, and then dividing the sum by the total number of corresponding pixels. An advantage of the present invention is that a sum of pixel values can be easily obtained while reading captured video data from the frame storage units 120, 122, 124, and 126.

Figure 2:
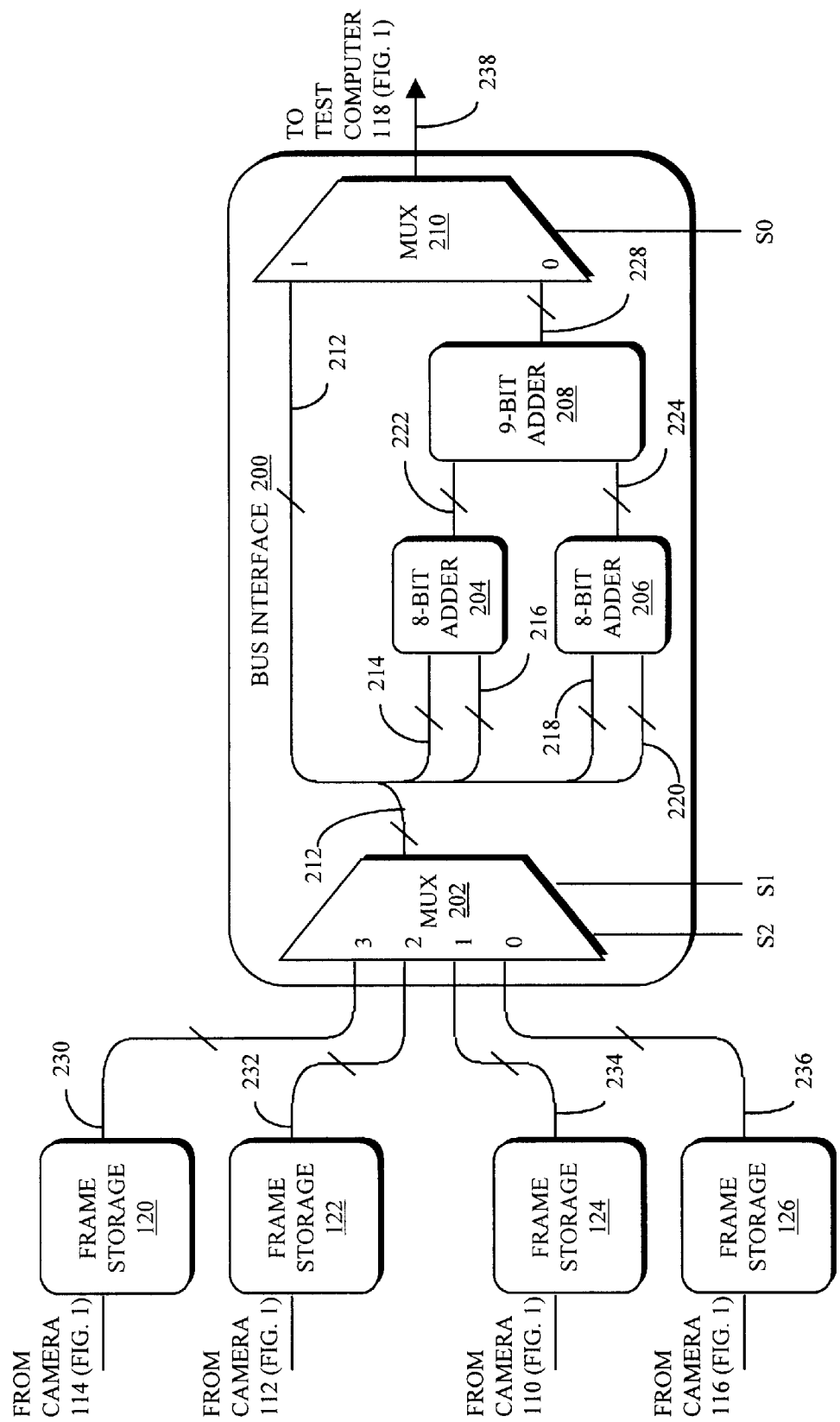
FIG. 2 is a partial block diagram of a manufacturing defect analyzer in accordance with the present invention.

FIG. 2 shows an improved bus interface 200 according to the present invention. The bus interface 200 includes a 4:1 multiplexor 202, 8-bit adders 204 and 206, a 9-bit adder 208, and a 2:1 multiplexor 210.

The manufacturing defect analyzer 100 is preferably based upon a 32-bit architecture. This means that the test computer 118 includes a 32-bit microprocessor (not shown), which is preferably a model M68040 microprocessor sold by MOTOROLA® Inc., Austin, Tex. Also, the width of data busses in the manufacturing defect analyzer 100 is also 32-bits. Also, the frame storage units 120, 122, 124, and 126 can store 32-bits of data in each memory location. Accordingly, the frame storage units 120, 122, 124, and 126 are preferably 32-bit wide static RAM's.

It follows that the frame storage units 120, 122, 124, and 126 provide captured video data to the bus interface 200, in particular the multiplexor 202, using 32-bit data busses 230, 232, 234, and 236. Further, the multiplexor 202 has select inputs S2 and S1, which are preferably controlled by the test computer 118. The multiplexor 202 can therefore select captured video data on either bus 230, 232, 234, or 236, and then place the data on another 32-bit data bus 212.

The bus 212 is coupled to the multiplexor 210, which also has a select input S0 preferably controlled by the test computer 118. The multiplexor 210 can therefore select the captured video data on bus 212, and place the data on still another 32-bit bus 238, which is coupled between the multiplexor 210 and the test computer 118. This is important because there is only one 32-bit data bus between the bus interface 200 and the test computer 118 in the preferred embodiment. By properly controlling the multiplexors 202 and 210, the test computer 118 can selectively access captured video data stored in frame storage units 120, 122, 124, and 126 via busses 230, 232, 234, and 236, respectively, and then receive the captured video data on the bus 238. Circuitry coupled between the test computer 118 and the frame storage units 120, 122, 124, and 126 for controlling and addressing the frame storage units 120, 122, 124, and 126, thereby allowing the test computer 118 to access the stored video data, is known to those skilled in this art and therefore is not shown.

Because the test computer 118 includes a 32-bit microprocessor (not shown), it can access either a byte (8-bits), a word (16-bits), or a long word (32-bits) of captured video data from the frame storage units 120, 122, 124, or 126 in a single memory operation. Further, because each pixel is preferably represented by a byte of captured video data, this means that a single memory operation can retrieve information relating to one pixel, two adjacent pixels, or four adjacent pixels.

As mentioned above, the test computer 118 can processes the captured video data by executing an algorithm that calculates the average brightness levels of a plurality of windows. This includes summing the values of pixels corresponding to the region of the BUI encompassed by each window, and then dividing the sum by the total number of corresponding pixels. For this reason, the bus interface 200 also includes the 8-bit adders 204 and 206, and the 9-bit adder 208, which are used for summing the pixel values.

In particular, the 8-bit adder 204 is connected to the 32-bit data bus 212 by two 8-bit data busses 214 and 216. Similarly, the 8-bit adder 206 is connected to the bus 212 by two 8-bit data busses 218 and 220.

The adder 204 is connected to the 32-bit bus 212 such that the bus 214 is connected to lines corresponding to the most significant 8-bits, i.e., bits 24 through 31; and, the bus 216 is connected to lines corresponding to the next most significant 8-bits, i.e., bits 16 through 23. Further, the adder 206 is connected to the 32-bit bus 212 such that the bus 218 is connected to lines corresponding to bits 8 through 15; and, the bus 220 is connected to lines corresponding to bits 0 through 7. This means that the values of two pairs of adjacent pixels, each pixel being represented by a byte of captured video data, can be summed simultaneously by the adders 204 and 206. Further, the two pairs of adjacent pixels can be any four pixels located in consecutive memory locations in either the frame storage unit 120, 122, 124, or 126.

Because the sum of two bytes of data can generate an overflow bit, both of the busses 222 and 224 are 9-bits wide. Accordingly, the adders 204 and 206 can add the two bytes of captured video data at their inputs, and place resulting sums on the busses 222 and 224, respectively.

Further, the adder 208 adds the pair of sums on the busses 222 and 224, and places the resulting sum on a bus 228, which is connected to an input of the multiplexor 210. Because the sum of two 9-bit words can also generate an overflow bit, the bus 228 is 10-bits wide.

The test computer 118 can therefore control the multiplexor 210 via its S0 input for selecting either the data on the 32-bit bus 212, or the sum of four bytes of data on the 10-bit bus 228. Because the bus between the bus interface 200 and the test computer 118 is 32-bits wide, the upper 22-bits of that bus are preferably set to logical "low" values when the test computer 118 controls the multiplexor 210 for selecting the 10-bit sum on the bus 228.

It follows that when the test computer 118 accesses a byte of captured video data from the frame storage unit 120, 122, 124, or 126, the byte appears at bit locations 0 through 7 on the bus 230, 232, 234, or 236, and bit locations 8 through 31 are preferably set to logical "low" values. This means that the test computer 118 can control the multiplexor 210 for accessing the byte on either the bus 212 or 228. This is because the adders 204, 206, and 208 merely add the accessed byte on the bus 220 to bytes on busses 218, 216, and 214 having zero values.

Further, when the test computer 118 accesses an "even" word of captured video data from the frame storage unit 120, 122, 124, or 126, the word appears at bit locations 0 through 15 on the bus 230, 232, 234, or 236, and bit locations 16 through 31 are preferably set to logical "low" values. This means that the test computer 118 can control the multiplexor 210 for accessing the word on bus 212, or for accessing the sum of two bytes at the bit locations 0 through 7, and 8 through 15, on bus 228.

Further, when the test computer 118 accesses an "odd" word of captured video data from the frame storage unit 120, 122, 124, or 126, the word appears at bit locations 16 through 31 on the bus 230, 232, 234, or 236 and bit locations 0 through 15 are preferably set to logical "low" values. This means that the test computer 118 can control the multiplexor 210 for accessing the word on bus 212, or for accessing the sum of two bytes at the bit locations 16 through 23, and 24 through 31, on bus 228.

Further, when the test computer 118 accesses a long word of captured video data from the frame storage unit 120, 122, 124, or 126, the long word appears at bit locations 0 through 31 on the bus 230, 232, 234, or 236. This means that the test computer 118 can control the multiplexor 210 for accessing the long word on bus 212, or for accessing the sum of four bytes at bit locations 0 through 7, 8 through 15, 16 through 23, and 24 through 31, on bus 228.

By including the adders 204, 206, and 208 in the bus interface 200, some of the processing tasks relating to the execution of algorithms are moved from the test computer 118 to the bus interface 200. This significantly reduces the amount of time required to execute many algorithms, and therefore reduces the amount of time required to inspect a PCB.

The bus interface 200 is particularly useful for reducing the amount of time required to execute the algorithm for determining the average brightness level of a window, which was considered above in the background of the present invention. For convenience, the pseudo-code for this algorithm is reproduced below.

```
X1=LEFT_EDGE;
X2=RIGHT_EDGE;
Y11=TOP_EDGE;
Y2=BOTTOM_EDGE;
SUM=0;
   FOR X=X1 TO X2 STEP_SIZE 1
   FOR Y=Y1 TO Y2 STEP_SIZE 1
   GET PIXEL(X,Y);
   SUM=SUM+PIXEL(X,Y);
   NEXT Y;
NEXT X;
AVERAGE=SUM/[(X2−X1)*(Y2−Y1)];
```

As mentioned above, "LEFT_EDGE," "RIGHT_EDGE," "TOP_EDGE," and "BOTTOM_EDGE" refer to the boundaries of a rectangular window, and "X" and "Y" define a position for each pixel within the window. Further, the steps of reading pixel information (i.e., GET PIXEL(X, Y)) and summing pixel values (i.e., SUM=SUM+PIXEL(X, Y)) must be repeated for every pixel within each window when using the traditional method for analyzing captured video data. Further, the step of summing pixel values is traditionally performed entirely by the test computer 118.

However, when the bus interface 200 is used according to the present invention, the test computer 118 can control the multiplexor 202 for accessing a long word of captured video data from either frame storage unit 120, 122, 124, or 126, and then control the multiplexor 210 for accessing the sum of values for four adjacent pixels on the bus 228. Because the bus interface 200 provides the sum of four adjacent pixel values, the steps of reading pixel information and summing pixel values need no longer be repeated for every pixel within each window.

For example, the bus interface 200 is particularly useful when determining the average brightness level of a rectangular window with one dimension being an integer multiple of four pixels. For this case, the test computer 118 can repetitively read long words of captured video data until information for each pixel within the window is read. Because each long word corresponds to four adjacent pixels, and the sum of the values of the four adjacent pixels can be obtained on the bus 228, the steps of reading pixel information and summing pixel values need be repeated only once for each group of four adjacent pixels. As a result, the average brightness algorithm for this window can be executed about four times faster than the traditional method.

The bus interface 200 is also useful when determining the average brightness level of windows that do not have one dimension that is equal to an integer multiple of four pixels. For these cases, the test computer 118 can repetitively read long words of captured video data until it approaches a window boundary, where it may be necessary to read either a word or a byte of captured video data. As described above, correct sums of pixel values can be obtained on bus 228 when accessing either a long word, a word, or a byte of video data. This means that although the average brightness algorithm for these windows might not be executed four times faster, it can still be executed significantly faster than the traditional method.

It should be understood that even if the bus interface 200 is used according to the present invention, the test computer 118 still must perform some summing of pixel values. However, instead of repetitively summing a single pixel value with the values of other pixels within a window, the test computer 118 can now add sums of two or four pixel values with the values of the other pixels within the window. This also significantly increases the rate at which the average brightness algorithm can be executed.

Having described one embodiment, numerous alternative embodiments or variations might be made. For example, it was described above that the manufacturing defect analyzer 100 includes four video cameras 110, 112, 114, and 116, and four frame storage units 120, 122, 124, and 126. However, this is merely an illustration. The manufacturing defect analyzer 100 may include more or fewer cameras and/or frame storage units. Further, a plurality of cameras might provide video data to just one frame storage unit.

Also, it was described that windows indicating regions on the BUI to be inspected are typically rectangular in shape. However, this is also merely an illustration. The present invention can process video data captured from windows having any useful shape.

Also, it was described that the bus interface 200 includes the 8-bit adders 204 and 206, and the 9-bit adder 208. These adders may include, but are not limited to, carry look-ahead adders or carry-save adders.

Also, it was described that each pixel is represented by a byte of captured video data, and that the width of data busses in the manufacturing defect analyzer 100 is 32-bits. However, this is merely an illustration. The present invention may be modified to accommodate pixels being represented by different numbers of bits of captured video data. The width of the data busses may also be suitably modified.

For example, an embodiment wherein each pixel is represented by a byte of captured video data might be implemented in a manufacturing defect analyzer with a 10-bit data bus. This is because the sum of four bytes, representing four pixels, can result in a 10-bit number. Further, another embodiment wherein each pixel is represented by a nybble (i.e., 4-bits) of captured video data, and wherein eight nybbles are added to produce a 7-bit number, might be implemented using a 7-bit data bus. This embodiment may also require multiplexors with more select inputs. Other embodiments are also possible.

It will therefore be understood by those skilled in this art that additions, deletions, and modifications can be made to the preferred embodiment described herein, without departing from the spirit and scope of the appended claims.

What is claimed is:

1. An improved apparatus for inspecting a printed circuit board, the apparatus including a test computer, an inspection head, and at least one frame storage unit, the improvement including a bus interface circuit coupled between the at least one frame storage unit and the test computer, the bus interface circuit comprising:

an adder circuit for adding values of digital data, the adder circuit having an input coupled to the at least one frame storage unit and an output; and a selector, having a first input coupled to the output of the adder circuit, a second input coupled to the input of the adder circuit, and an output coupled to the test computer, the selector selecting between the output of the adder circuit and the input of the adder circuit in response to at least one control bit produced by the test computer wherein a 32-bit data bus connects the input to the at least one frame storage unit; and wherein the adder circuit includes a first 8-bit adder having a first input connected to lines corresponding to bits 0 through 7 of the 32-bit data bus, a second input connected to lines corresponding to bits 8 through 15 of the 32-bit data bus, and an output, a second 8-bit adder having a first input connected to lines corresponding to bits 16 through 23 of the 32-bit data bus, a second input connected to lines corresponding to bits 24 through 31 of the 32-bit data bus, and an output, and a 9-bit adder having a first input connected to the output of the first 8-bit adder, a second input connected to the output of the second 8-bit adder, and an output connected to the output of the adder circuit.

2. The improved apparatus as recited in claim 1, wherein the bits 0 through 7, the bits 8 through 15, the bits 16 through 23, and the bits 24 through 31 each correspond to one pixel.

3. An improved, computer-implemented method for inspecting a printed circuit board, comprising the steps of:

(a) generating a list of windows to be inspected, each window encompassing a respective region of the printed circuit board;

(b) scanning the windows for capturing data representative of the respective regions, the captured data including data corresponding to a plurality of pixels;

(c) storing the data corresponding to the plurality of pixels in at least one frame storage unit;

(d) retrieving data relating to a plurality of adjacent pixels from the at least one frame storage unit;

(e) summing, values of the data relating to the plurality of adjacent pixels;

(f) selecting between the data retrieved in step (d) and the sum of data values; and (g) conveying the selection to a test computer for subsequent processing, wherein the step (e) of summing includes applying the values of data relating to the plurality of adjacent pixels to a dedicated hardware adding circuit, wherein the dedicated hardware adder circuit includes— a first adder having a first input receiving a first portion of the values of data, a second input receiving a second portion of the values of data, and an output, a second adder having a first input receiving a third portion of the values of data, a second input receiving a fourth portion of the values of data, and an output, and a third adder having a first input coupled to the output of the first adder, a second input coupled to the output of the second adder, and an output coupled to the output of the adder circuit.

4. The method as recited in claim 3, wherein each window has dimensions 0.050 inch by 0.050 inch.

5. The method as recited in claim 3, wherein each pixel is represented by a byte of captured data.

6. The method as recited in claim 3, wherein each value summed in step (e) is proportional to a brightness level of a portion of a respective region of the printed circuit board.

7. The method as recited in claim 6, further comprising the step of calculating an average brightness level for each window.

8. The method as recited in claim 7, wherein the step of calculating includes the substeps of summing values of data relating to pixels corresponding to respective windows, and dividing each sum by the total number of pixels corresponding to the respective window.

9. An improved apparatus for inspecting a printed circuit board, the apparatus including a test computer, an inspection head, and at least one frame storage unit, the improvement including a bus interface circuit coupled between the at least one frame storage unit and the test computer, the bus interface circuit comprising:

an adder circuit for adding values of digital data, the adder circuit having an input coupled to the at least one frame storage unit and an output; and a selector, having a first input coupled to the output of the adder circuit, a second input coupled to the input of the adder circuit, and an output coupled to the test computer, the selector selecting between the output of the adder circuit and the input of the adder circuit in response to at least one control bit produced by the test computer, wherein a data bus connects the input of the adder circuit to the at least one frame storage unit, and the adder circuit includes— a first adder having a first input receiving a first portion of bits of the data bus, a second input receiving a second portion of bits of the data bus, and an output, a second adder having a first input receiving a third portion of bits of the data bus, a second input receiving a fourth portion of bits of the data bus, and an output, and a third adder having a first input coupled to the output of the first adder, a second input coupled to the output of the second adder, and an output coupled to the output of the adder circuit.

10. The improved apparatus as recited in claim 9, wherein the first, second, third, and fourth portions of bits each correspond to one pixel.

11. The improved apparatus as recited in claim 10, wherein the inspection head includes a plurality of cameras mounted therein.

12. The improved apparatus as recited in claim 10, wherein the cameras are positioned in the inspection head so that respective axes of the cameras converge on a surface of the printed circuit board, thereby defining a viewing field for the cameras.

13. The improved apparatus as recited in claim 12, wherein the viewing field has dimensions 1 inch by 1 inch.

14. The improved apparatus as recited in claim 10, wherein the inspection head includes a lighting fixture for selectively illuminating a region of the printed circuit board.

15. The improved apparatus as recited in claim 11, wherein the cameras are coupled to the at least one frame storage unit for providing the digital data to the at least one frame storage unit.

16. The improved apparatus as recited in claim 15, wherein the digital data is representative of at least one region of the printed circuit board.

17. The improved apparatus as recited in claim 16, wherein the digital data includes information relating to a plurality of pixels corresponding to the at least one region of the printed circuit board.

18. The improved apparatus as recited in claim 17, wherein each pixel includes one byte of digital data.

19. The improved apparatus as recited in claim 18, wherein each pixel has a value proportional to the brightness level of a corresponding portion of the at least one region of the printed circuit board.

20. The improved apparatus as recited in claim 10, further comprising a second selector, having a plurality of inputs coupled to the at least one frame storage unit and an output coupled to the input of the adder circuit, for selecting between a plurality of frame storage units in response to at least one control bit produced by the test computer.

* * * * *